(12) United States Patent
Clark et al.

(10) Patent No.: US 6,589,382 B2
(45) Date of Patent: Jul. 8, 2003

(54) ALIGNING MASK SEGMENTS TO PROVIDE A STITCHED MASK FOR PRODUCING OLED DEVICES

(75) Inventors: Thomas K. Clark, Walworth, NY (US); Gopalan Rajeswaran, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 30 days.

(21) Appl. No.: 09/994,095

(22) Filed: Nov. 26, 2001

(65) Prior Publication Data

US 2003/0098124 A1 May 29, 2003

(51) Int. Cl.⁷ .............................................. C23C 16/00
(52) U.S. Cl. ................... 156/304.3; 118/720; 118/721; 118/504; 118/505
(58) Field of Search ....................... 156/304.3; 118/720, 118/721, 504, 505

(56) References Cited

U.S. PATENT DOCUMENTS

| | | | | |
|---|---|---|---|---|
| 4,676,193 A | * | 6/1987 | Martin | 118/720 |
| 6,146,489 A | * | 11/2000 | Wirth | |
| 6,475,287 B1 | * | 11/2002 | Clark | 118/721 |
| 2002/0102754 A1 | * | 8/2002 | Fujimori et al. | |

* cited by examiner

*Primary Examiner*—Curtis Mayes
(74) *Attorney, Agent, or Firm*—Raymond L. Owens

(57) ABSTRACT

An alignment device for permitting a deposition mask having a plurality of mask segments to be positioned relative to a substrate to facilitate simultaneous deposition of organic material on to the substrate which will be part of an organic light emitting device.

8 Claims, 4 Drawing Sheets

US 6,589,382 B2

ALIGNING MASK SEGMENTS TO PROVIDE A STITCHED MASK FOR PRODUCING OLED DEVICES

CROSS REFERENCE TO RELATED APPLICATIONS

Reference is made to commonly-assigned copending U.S. patent application Ser. No. 09/893,250, filed Jun. 21, 2001, now U.S. Pat. No. 6,475,287 entitled "Alignment Device Which Facilitates Deposition Of Organic Material Through A Deposition Mask", by Thomas K. Clark, the disclosure of which are incorporated herein."

FIELD OF THE INVENTION

The present invention relates to the deposition of organic material through a mask onto a substrate in the process of making an organic light emitting diode (OLED).

BACKGROUND OF THE INVENTION

In the making of organic light emitting devices (OLED) there are a number of steps in which organic layers are deposited on or over a substrate. It is essential that a deposition mask be aligned and properly mounted so that accurate deposition takes place. The deposition mask is typically a precision mask made of a magnetic material and is thin and malleable. The deposition mask is lithographically patterned and because it is thin permits the appropriate thickness of organic material to be deposited on or over the substrate. The maximum size of a single piece depositions mask is limited by manufacturing process limitations, specifically dimensional accuracy and overall size. Another limitation of the present technology is the inability to replace damaged areas of the deposition mask. The deposition mask manufacturing process is subject to error and the increase in size and complexity of a mask design account for lower yield when manufacturing deposition masks. There is a need for more accurate, larger format precision deposition mask. There is also a need for a method of replacement of defective areas of the deposition mask.

SUMMARY OF THE INVENTION

It is an object of the present invention to increase the throughput of forming OLED devices which use deposition masks.

It is a further object of the present invention to provide a structure which will permit the simultaneous formation of organic layers of an OLED device through different mask segments.

These objects are achieved in alignment device for permitting a deposition mask having a plurality of mask segments to be positioned relative to a substrate to facilitate simultaneous deposition of organic material on to the substrate which will be part of an organic light emitting device, comprising:

(a) a base having a first set of alignment pins and a second set of alignment pins;

(b) a plate secured to the base;

(c) a frame having an opening aligned with the plate, the frame being formed with a first set of alignment pin receiving holes corresponding to the position of the first set of pins so that the frame is removably mounted to the base;

(d) a plurality of mask segments positioned on the plate to define the deposition mask;

(e) a transparent flat plate contacting the second set of alignment pins and the deposition mask and being sized to expose segments of the deposition mask;

(f) means for securing the mask segments to each other; and (g) means for securing the deposition mask to the frame.

These objects are also achieved by A method of aligning a plurality of masks segments to form a mask which permits a more effective manufacture of organic light emitting diode devices, comprising the steps of:

(a) providing a base having a first and second set of alignment pins and securing a plate to the base;

(b) providing a frame having an opening aligned with the plate and formed with a first set of alignment pin receiving holes;

(c) aligning the frame and base by positioning the first set of alignment pins in the first set of alignment pin receiving holes;

(d) positioning the plurality of mask segments on the plate;

(e) providing a transparent flat plate aligned with the second set of alignment pins on the plurality of mask segments, such transparent flat plate having fiducial marks;

(f) positioning the mask segments to be properly aligned with the fiducial marks and securing the mask segments to the frame; and (g) bonding the plurality of mask segments to provide a stitched mask with each mask segment being adapted to be used in the deposition of organic material on a single substrate.

It is a feature of the present invention that by mounting and securing mask segments a stitched mask can be produced that provides improved dimensional accuracy of a deposition mask having the ability to remove and replace mask sections. The present invention makes possible the manufacture of a larger format deposition mask. The mask sections can be attached to each other using a removable adhesive and will be mounted to a frame.

An advantage of the present invention is that the deposition mask sections can be accurately assembled and mounted to a frame that is then positioned relative to the substrate. Deposition mask sections can be stitched together to make a mask assembly larger than is capable with single piece deposition mask. A stitched mask can be disassembled to allow for removal of defective deposition mask sections. The mask sections can then be replaced. A stitched deposition mask being made up of small sections are less expensive to produce. Stitched masks have greater life expectancy, being repairable. A stitched deposition mask is assembled having greater accuracy than present process. This approach will improve yield and make possible deposition of larger substrates.

DETAILED DESCRIPTION OF THE PREFERRED EMBODIMENTS

Figure 1:
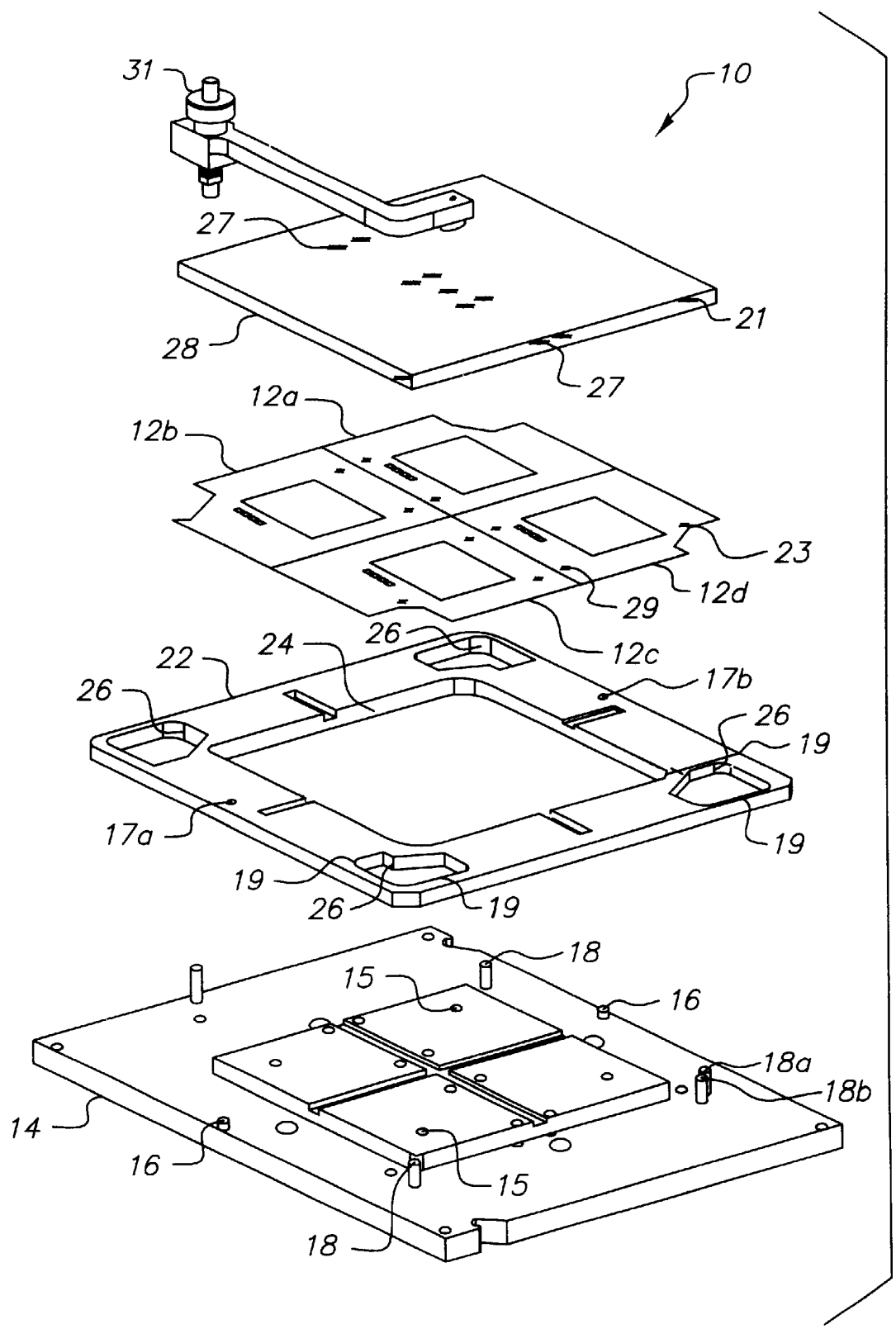
FIG. 1 is an exploded view of an alignment device for assembly and deposition in accordance with the present invention.

FIG. 1 depicts an exploded view of an alignment device 10 for assembly and mounting of a stitched deposition mask 12. On the deposition mask 12 there are four segments 12a, 12b, 12c, 12d (See FIG. 4). The mask segments are aligned with engraved alignment lines 19 on frame 22 when the disposition mask 12 is positioned. The alignment device 10 permits the deposition mask 12 to be positioned relative to a substrate of an OLED device to facilitate simultaneous deposition of organic material on to the substrate which will be part of an organic light emitting device. The alignment device 10 includes a base 14 having a first set of alignment pins 16 and a second set of alignment pins 18. The alignment pins 16 as shown include two pins disposed on opposite sides of the base 14. The base 14 is generally rectangular and the second set of alignment pins 18 are disposed in three corners of the base 14. As shown, in one of the corners there are two alignment pins 18a and 18b but in the remaining two corners there is a single alignment pin 18.

A plate 20 is secured to the base 14 by any convenient means. The plate 20 is fastened by screws to the base 14. Although the screws are not shown for convenience of illustration are depicted by holes 15. The plate 20 provides a top flat surface on which the deposition mask 12 is to be positioned. A frame 22, generally rectangular in shape, has a central opening 24. Around each of the four corners of the frame 22 there are cutout segments 26. In three of the cutout segments 26, the alignment pins 18 project through (see FIG. 2.)

The purpose of these cutout segments 26 is to facilitate positioning of the frame 22 in a vacuum chamber which permits the engagement of a mechanism in the vacuum chamber as well understood in the art. The frame 22 is removable and mounted to the base 14 using alignment pins 16. The alignment pins 16 pass through holes 17a and 17b in the frame 22. The hole 17a has a circular cross-section and hole 17b has an oblong shape to permit proper alignment. The deposition mask 12 includes segments 12a, 12b, 12c, and 12d are positioned on plate 20 and frame 22. A transparent flat plate 28 is positioned to contact the second set of alignment pins 18 and deposition mask 12 and is sized to expose edge segments of the deposition mask 12 when it is properly positioned. The transparent flat plate 28 includes fiducial marks 21 and 27 which are electroplated. The fiducial marks 21 and 27 are cross lines which are shown larger than they actually are. The fiducial marks 21 and 27 are used to permit alignment with fiducial marks 23 and 29 on the deposition mask 12. The alignment of fiducial marks 27 and 29 form an appropriate relationship between mask segments 12a, 12b, 12c, and 12d. The exposed segments of the deposition mask 12 are secured to the frame 22. It can be secured by adhesive or magnetic material.

Figure 4:
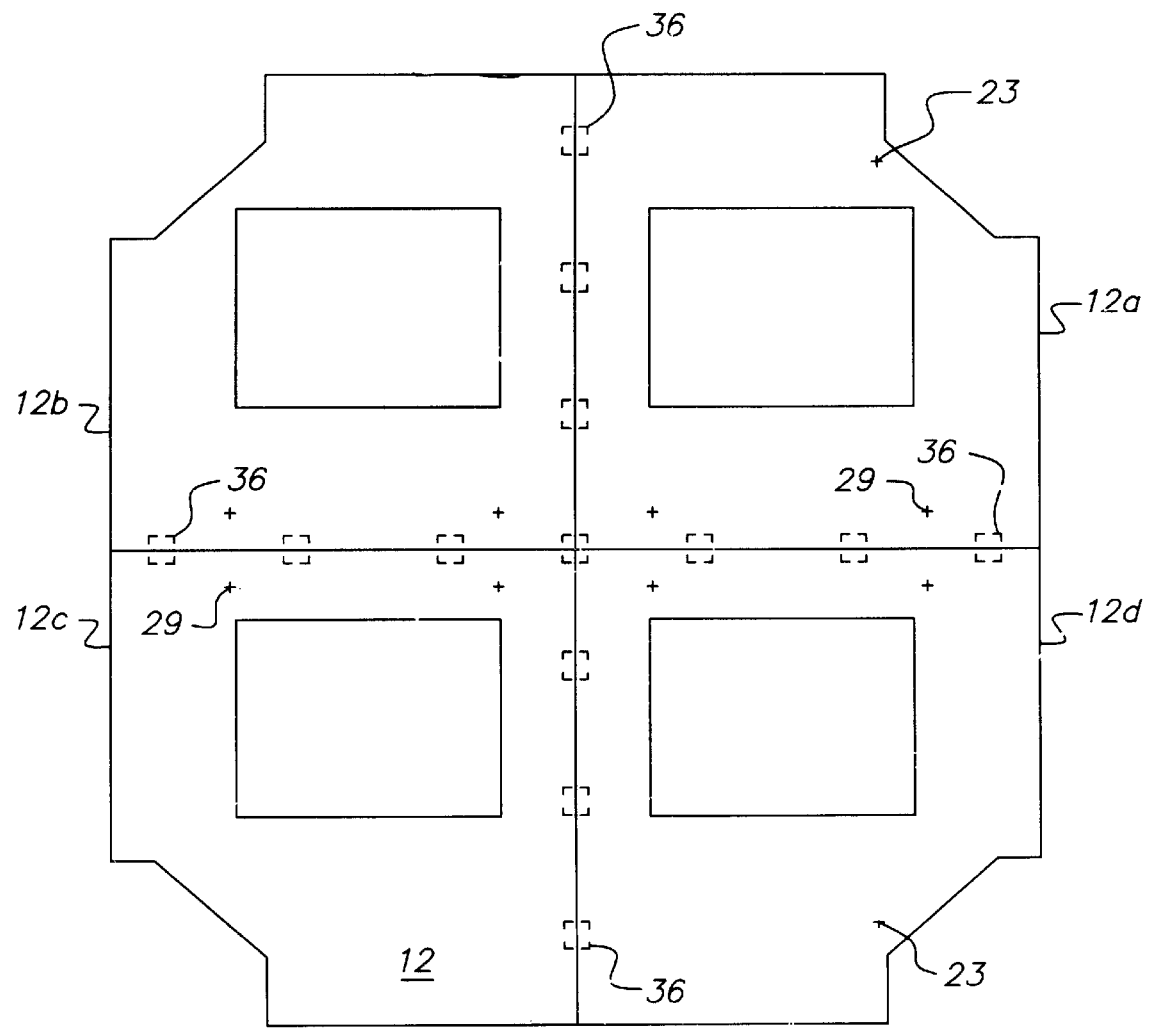
FIG. 4 is a top view of a stitched mask having a plurality of mask segments which is usable in the alignment device of FIG. 1.

Mask segments 12a, 12b, 12c, 12d are secured to each other as will be described in more detail when FIG. 4 is discussed.

Figure 2:
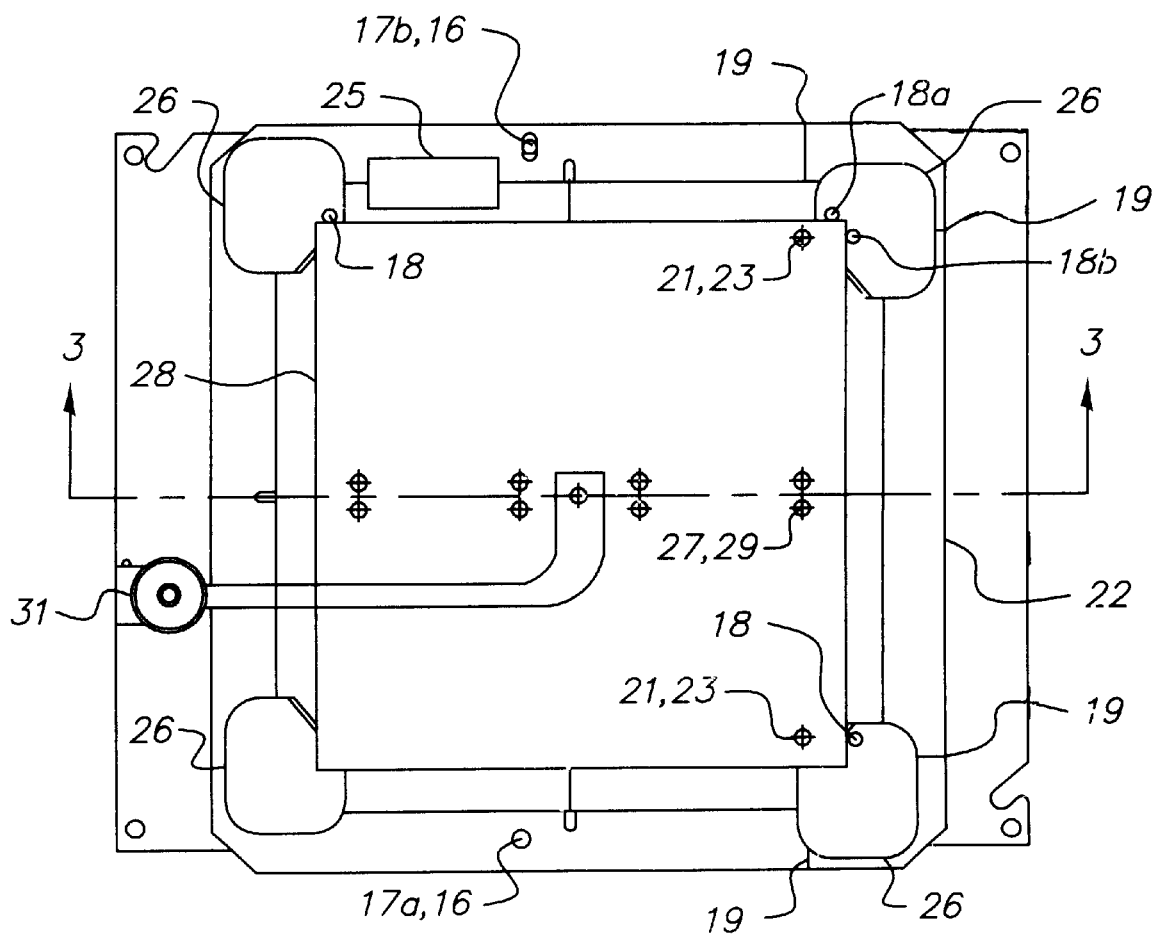
FIG. 2 is a top view of the alignment device of FIG. 1.
Figure 3:
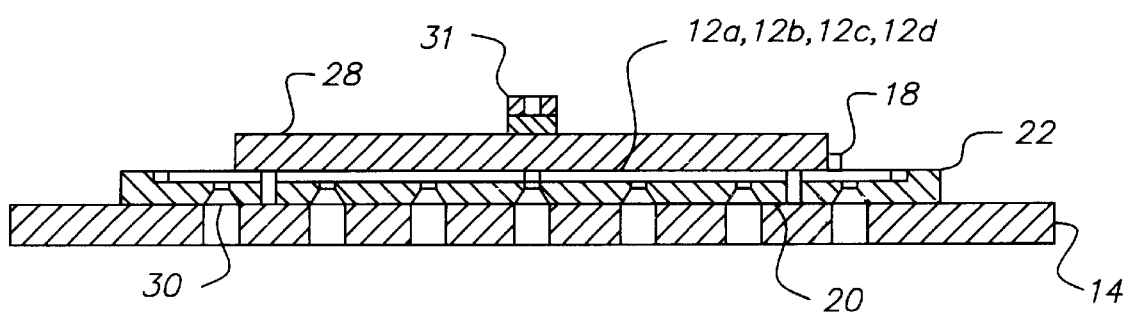
FIG. 3 is a cross sectional view taken along lines 3—3 of FIG. 2.

Turning now to FIGS. 2 and 3 which respectively show a top view of the alignment device 10 and a cross-sectional view taken along lines 3—3. In particular with reference to FIG. 3, the base 14, plate 20, the deposition mask 12 and the transparent flat plate 28 are shown stacked one on top of the other. The top surface of frame 22 is shown to be planar with plate 20. The pins 16 and 18 are not shown for clarity of illustration. One of the pins 18 is shown in its alignment position.

The alignment of the deposition mask 12 in the alignment device 10 will now be described. The frame 22 is mounted on base 14 using alignment pins 16. The alignment pins 16 are located on the base 14 in such a manner that frame 22 can be mounted in one orientation only. The frame 22 when mounted on base 14 is to be positioned in a manner that aligns plate 20 top surface is at the same identical height as frame 22. The deposition mask segments 12a, 12b, 12c, 12d are visually aligned on top of plate 20 and frame 22 using engraved alignment lines 19 on frame 22 for initial alignment as shown in FIG. 1. The transparent flat plate 28 is placed on top of deposition mask 12 and against alignment pins 18, 18a, and 18b. The deposition mask segments 12a, 12b, 12c, 12d are manually aligned using the photo-etched fiducials 23 and 29 corresponding with fiducials 21 and 27 located on transparent flat plate 28. The relationship of transparent flat plate 28 and alignment pins 18, 18a, and 18b must remain against the alignment pins 18a and 18b during the alignment process. After alignment the deposition mask sections are held in place using clamp 31.

The deposition mask 12 is then attached to frame 22 using one of two methods. In the first method adhesive strips 25 secure the deposition mask 12 to the frame 22. Only one of the adhesive strips 25 is shown although typically there will be two for each edge and they secure the deposition mask 12 to the frame 22. The mask segments 12a, 12b, 12c and 12d are then bond to each other using access locations 30 depicted in FIG. 3.

Alternatively, the deposition mask 12 can be made from magnetic material. The amount of ferrous metals is such that the field exerted by the magnets provide within the frame 22 causes the deposition mask 12 to be secured to the frame 22 and held in a planar fashion. The second method is particularly suitable when it is not desirable to use adhesives. Both the first and second methods can however be simultaneously used in certain applications.

Turning now to FIG. 4, is a representation of the deposition mask 12. The deposition mask 12 has two or more segments. Wherever the term "stitching" is used it refers to the fact that the mask segments are secured to each other. The bonding material can be adhesive or can be a small piece of adhesive material. The bonding of the mask segments 12a, 12b, 12c, 12d can be accomplished by using a removable adhesive. The removable adhesive can be removed by ultraviolet (UV) light to thereby permit the replacement of one or more mask segments 12a, 12b, 12c 12d. As shown there are individual pieces of adhesive tape 36 which secure, bond or stitch the four mask segments 12a, 12b, 12c, 12d to provide the single stitched deposition mask 12. The adhesive tape 36 can also be made removable. After the deposition mask 12 has been assembled and mounted on frame 22 using alignment device 10, the transparent flat plate 28 is removed. The assembled deposition mask 12 and frame 22 are removed from base 14. It is the assembled deposition mask 12 and frame 22 that are placed in a chamber (not shown).

The invention has been described in detail with particular reference to certain preferred embodiments thereof, but it will be understood that variations and modifications can be effected within the spirit and scope of the invention.

PARTS LIST 10 alignment device
12 deposition mask
12a mask segment
12b mask segment
12c mask segment
12d mask segment
14 base
15 holes
16 first set of alignment pins 17a hole
17b hole
18 second set of alignment pins
18a alignment pin
18b alignment pin
19 engraved alignment lines
20 plate
21 fiducial marks
22 frame
23 fiducial marks
24 opening
25 tape
26 cut-out segment
27 fiducial marks
28 transparent flat plate
29 fiducial marks
30 access locations
31 clamp
32 magnet
36 adhesive tape

What is claimed is:

1. An alignment device for permitting a deposition mask having a plurality of mask segments to be positioned relative to a substrate to facilitate simultaneous deposition of organic material on to the substrate which will be part of an organic light emitting device, comprising:

(a) a base having a first set of alignment pins and a second set of alignment pins;
    (b) a plate secured to the base;
    (c) a frame having an opening aligned with the plate, the frame being formed with a first set of alignment pin receiving holes corresponding to the position of the first set of pins so that the frame is removably mounted to the base;
    (d) a plurality of mask segments positioned on the plate to define the deposition mask;
    (e) a transparent flat plate contacting the second set of alignment pins and the deposition mask and being sized to expose segments of the deposition mask;
    (f) means for securing the mask segments to each other; and
    (g) means for securing the deposition mask to the frame.

2. A method of aligning a plurality of masks segments to form a mask which permits a more effective manufacture of organic light emitting diode devices, comprising the steps of:

(a) providing a base having a first and second set of alignment pins and securing a plate to the base;
    (b) providing a frame having an opening aligned with the plate and formed with a first set of alignment pin receiving holes;
    (c) aligning the frame and base by positioning the first set of alignment pins in the first set of alignment pin receiving holes;
    (d) positioning the plurality of mask segments on the plate;
    (e) providing a transparent flat plate aligned with the second set of alignment pins on the plurality of mask segments, such transparent flat plate having fiducial marks;
    (f) positioning the mask segments to be properly aligned with the fiducial marks and securing the mask segments to the frame; and
    (g) bonding the plurality of mask segments to provide a stitched mask with each mask segment being adapted to be used in the deposition of organic material on a single substrate.

3. The method of claim 2 where in the first set of alignment pins include two spaced apart pins positioned to align the frame relative to the base and plate.

4. The method of claim 2 wherein the frame includes four spaced cut out mask segments and the second set of alignment pins extend beyond the surface of the frame in three of the four cut out mask segments to engage the plate and wherein at least two of the alignment pins of the second set of alignment pins are positioned in one cut out mask segment to engage two separate edges of the plate.

5. The method of claim 2 wherein the frame includes alignment lines for positioning the edges of the deposition mask to properly align such deposition mask on the plate.

6. The method of claim 2 wherein the transparent plate and the mask include fiducial marks which also when aligned facilitate proper alignment of the mask to the frame.

7. The method of claim 2 wherein the bonding of the mask segments is accomplished by using a removable adhesive.

8. The method of claim 2 wherein the removable adhesive is removable by UV light to thereby permit the replacement of a mask segment.

* * * * *